(12) United States Patent
Portune

(10) Patent No.: US 8,159,243 B2
(45) Date of Patent: Apr. 17, 2012

(54) PROBE TIP TO DEVICE PAD ALIGNMENT IN OBSCURED VIEW PROBING APPLICATIONS

(75) Inventor: Richard Alan Portune, Sunnyvale, CA (US)

(73) Assignee: DCG Systems, Inc., Fremont, CA (US)

( * ) Notice: Subject to any disclaimer, the term of this patent is extended or adjusted under 35 U.S.C. 154(b) by 259 days.

(21) Appl. No.: 12/617,619

(22) Filed: Nov. 12, 2009

(65) Prior Publication Data

US 2010/0117672 A1 May 13, 2010

Related U.S. Application Data

(60) Provisional application No. 61/114,430, filed on Nov. 13, 2008.

(51) Int. Cl.
*G01R 31/308* (2006.01)
(52) U.S. Cl. ........... 324/750.23; 324/754.1; 324/750.16; 382/145; 382/151
(58) Field of Classification Search ............... 324/750.23
See application file for complete search history.

(56) References Cited

U.S. PATENT DOCUMENTS

| 4,892,122 A | 1/1990 | Ickes |
| 5,742,174 A | 4/1998 | Kister et al. |
| 6,639,420 B1 | 10/2003 | Chen et al. |
| 7,382,914 B2 * | 6/2008 | Obi ............................... 382/151 |
| 7,528,937 B1 * | 5/2009 | Crespin et al. ................... 355/75 |
| 2009/0189299 A1 | 7/2009 | Miranda et al. |
| 2009/0224789 A1 | 9/2009 | Newton et al. |

OTHER PUBLICATIONS

Mark Allison, "Wafer Probe Acquires a New Importance in Testing," Chip Scale Review, May/Jun. 2005, Electroglas Inc., San Jose, CA.

* cited by examiner

*Primary Examiner* — Richard Isla Rodas
(74) *Attorney, Agent, or Firm* — Nixon Peabody LLP; Joseph Bach, Esq.

(57) ABSTRACT

A method of performing alignment of an array of probe tips of a probe card to corresponding contact pads for wafer probing applications by performing the steps of: obtaining a backside image of the wafer; overlaying a mapping of the contact pads over the backside image; selecting contact pads as landing points; obtaining an image of the probe tips array; comparing the landing points to corresponding positions of probe tips; and, if the positions of probe tips are not aligned with the landing point, rotating the probe card to align the positions of probe tips to the landing points.

20 Claims, 7 Drawing Sheets

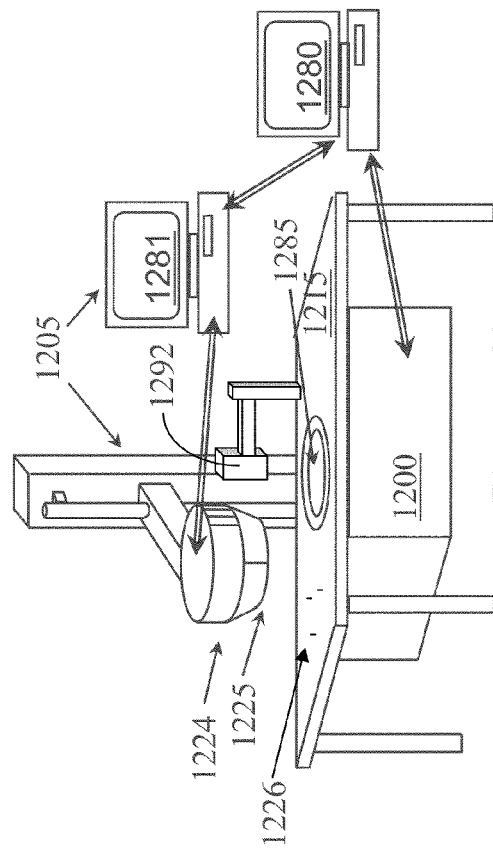
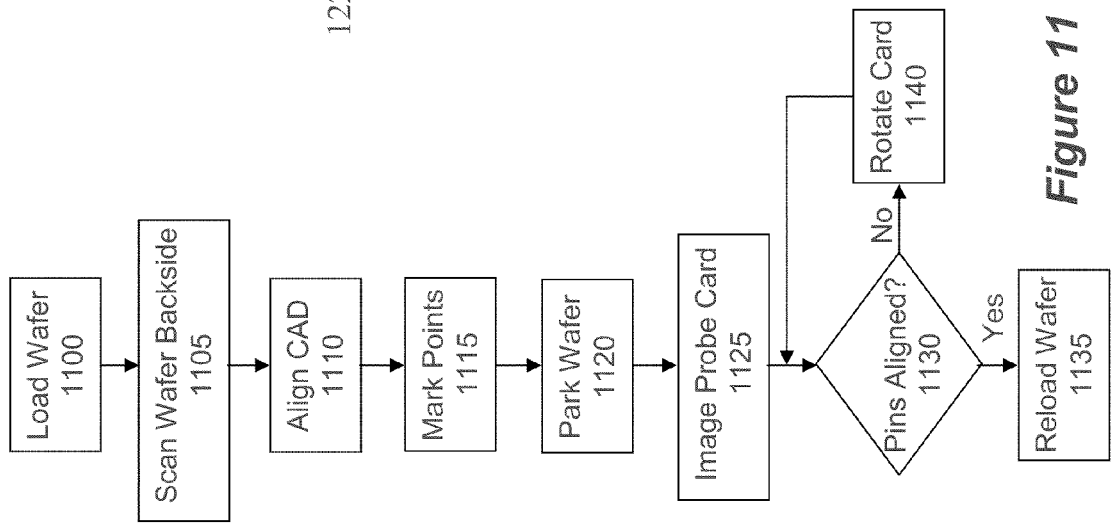
Figure 12
Figure 11

PROBE TIP TO DEVICE PAD ALIGNMENT IN OBSCURED VIEW PROBING APPLICATIONS

RELATED APPLICATIONS

This application claims priority benefit from U.S. Provisional Patent Application Ser. No. 61/114,430, filed Nov. 13, 2008.

BACKGROUND

1. Field

This invention is in the field of semiconductor wafer probing and, more specifically, relates to alignment of a probe tip to a device under test.

2. Related Art

Semiconductor wafers generally undergo probing using a probe card which makes contact to conductive pads on top of the IC. As technology advances, probing of wafers becomes more important in order to ensure proper designs and acceptable yield. However, as technology advances, the number of pads increases while the size of individual pads and the pitch between pads decrease. This makes it much harder to ensure that all contacts of the probe card make proper contact to the corresponding pads.

Device probe pads are the topmost layer of a chip. Prior art techniques for PTPA (Probe To Pad Alignment) require an unobstructed view of such pads from the backside of the wafer, and an infrared camera to see them through the silicon substrate. However, modern fabrication techniques for semiconductors place many layers of interconnecting metal (as many as 10 or more) between the topmost and bottommost layers in a device. These metal layers block all visibility of probe pads from below and thus render such existing techniques inadequate.

FIGS. 1-3 illustrate prior art arrangements for probe pins alignment. In FIG. 1, wafer 100 is held by a chuck 105, which is attached to an x-y stage 110. A camera 115 is also attached to the x-y stage 110. To perform the alignment, the stage is scanned so that the camera 115 can take pictures of the probe tips 120 of probe card 125. The image is used to form a mapping of the tips' locations. In FIG. 2, an infrared camera 215 is used to image both the pads 202 on the wafer 200 and the probe tips 220 of probe card 225. As shown in FIG. 2, in position A, camera 215 is focused on the plane where the pads are, so that it images the pads 202 through the silicon wafer (hence the use of infrared, to which silicon is transparent). At position B, camera 215 is focused on the plane where pins 220 are, so that it images the pins 220, also through the silicon wafer. When no or very few metallic lines are fabricated on the wafer, the IR camera can image both the pads and the probe tip through the silicon. This is shown in FIG. 3, wherein the pads are shown as squares and the probe tips are shown as round. However, when several layers of metal lines are fabricated on the wafer, the lines block the view of the camera and prevents imaging the pads and/or the probe tips, so that proper alignment cannot be verified using this technique.

Therefore, new apparatus and methods are needed in order to ensure proper alignment of probe tips to contact pads, even when several layers of metal lines are fabricated on the wafer.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of this invention solve the problem of proper alignment of probe tips to contact pads when metal lines obstruct the view through the silicon. Aligning probe card pins to wafer device pads using upward-looking camera cannot be performed when the view of pins and pads is obscured due to probe card technology and multiple metal layer semiconductor fabrication technology. Accordingly, various embodiments are described which use a combination of views of the probe pin array, device images, and/or device CAD (Computer-Aided Design) map overlaid, so as to achieve alignment in X, Y, and Theta (rotation). Certain embodiments are facilitated by the upwards-looking infrared camera subsystem of a standard emission or laser probing microscope.

According to one embodiment, the device's CAD information is overlaid on a captured image of the actual device to provide the necessary probe pad location information. Therefore, the conventional view of the top layer through the backside of the device is not require. This "virtual device" information is then compared spatially with probe card pin array information taken by the upwards looking camera when the wafer is not present. Adjustments can then be made to the relative positions of wafer and probe card until the two are brought into alignment.

According to another embodiment, a high-resolution camera is used to take an image of the actual top side of a die on the wafer to be aligned, thereby showing the locations of the contact pads. The camera may be mounted in any location which affords an unobstructed view of the wafer top surface. In fact, it is not necessary that the camera be mounted to the probing system because the image may ultimately be manipulated by the probing system to match the scale and position of backside images generated by the IR microscope system in the tool. Once the image is captured, it may be manipulated digitally to scale, rotate, clip, and otherwise match it to the backside image of the die as captured by the upward looking IR camera. The image is then rendered translucent and merged to the backside image so as to overlay the two images. That is, the top side image is matched to edge features which are visible both from the top side and back side of the die and a composite "virtual transparent" die image is created.

The "transparent" feature refers to the fact that a normal image of the device backside, as captured by an IR microscope, cannot see through the device to its top side because intervening metal layers in the semiconductor device obscure the image. By merging the front side and back side images into a single image, we create an image similar to what would be seen if the device were transparent. Because this image is based on actual images of the die to be aligned it can be used in the wafer prober Probe-to-Pad alignment process.

According to yet another embodiment, a full composite image of backside, CAD, and topside is created to improve the accuracy and effectiveness of this method. However, when a CAD design is not available, the method can be performed without overlay of the CAD design.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 11 illustrates a flow chart of a process according to an embodiment of the invention for aligning probe card pins to contact pads of die on a wafer.

FIG. 12 illustrates an embodiment that can be used in such circumstances to reach alignment without the need for a special camera and optical setup to simultaneously view wafer dies and probe cards.

DETAILED DESCRIPTION

Various embodiments of the invention provide apparatus and method for merging wafer die images from multiple sources to create a pseudo-transparent wafer die image to facilitate alignment of wafer dies to wafer probe cards. This inventive technique is applicable to all wafer types (including wafers with multiple metal layers which obscure through-wafer IR microscopy) and probe card types (including vertical, "cobra" type probe cards and other probe card types with no center viewing port).

While the invention may be implemented using a verity of arrangements, it is especially beneficial for use in probing microscopes, such as, e.g., emission microscopes and laser voltage probers such as the Meridian™ WaferScan available from DCG Systems of Fremont. Therefore, various embodiments of the invention will be described as implemented in such systems.

Figure 2:
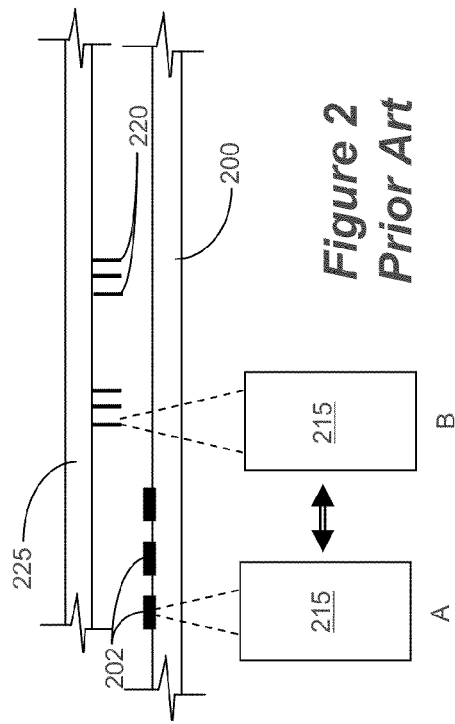
FIGS. 1-3 illustrate prior art arrangements for probe pins alignment.
Figure 4:
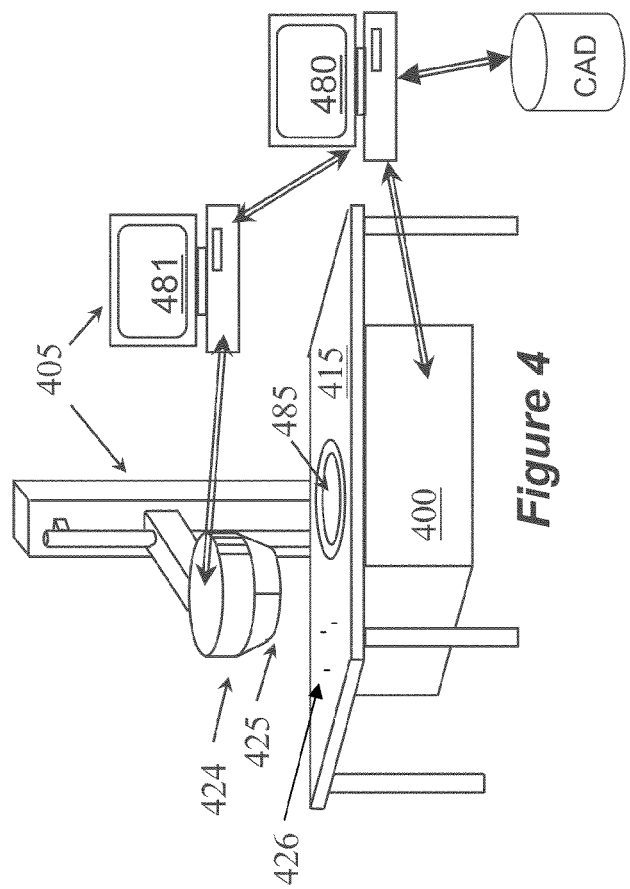
FIG. 4 illustrates a general schematic of a probing microscope which can be used for implementing embodiments of the invention.
Figure 1:
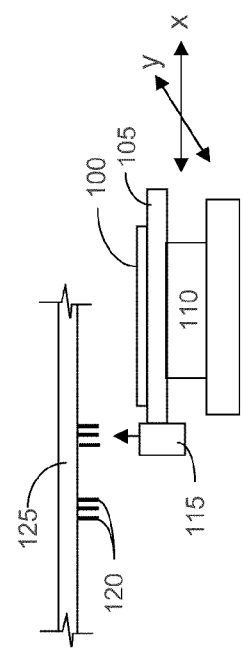
Figure 3:
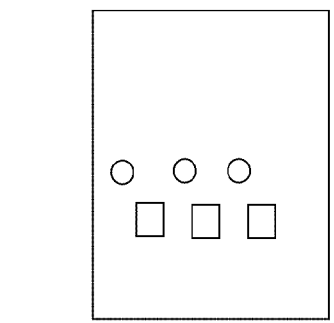

A general schematic of a probing microscope which can be used for implementing embodiments of the invention is depicted in FIG. 4. The system illustrated in Figure is particularly suitable for timing, emission, failure, and other testing of dies on wafers, especially from the backside through the substrate. The system is shown as operating in conjunction with a commercially available automated testing equipment 405 (ATE). The ATE 405 generally comprises a controller, such as a preprogrammed computer 481, and a test head 424 which comprises an probing card 425 used to deliver signals (vectors) generated by the controller 481 to the device under test (DUT—in this context, the selected die on the wafer) 410 in a manner well known in the art. Specifically, the ATE 405 is used to generate signals that stimulate the DUT 410 to perform various tasks, as designed by the chip designer to check and/or debug the chip.

In the embodiment depicted in FIG. 4, the ATE test head 424 is placed on top of a vibration isolated test bench 415, while the chamber 400 that houses the entire optics, imaging and sensing of the microscope system, is situated below. This provides a tremendous advantage as it allows the system to be used with any type and size of ATE without interference with, or making modification to any of the elements inside chamber 400. Rather, the ATE is used to place the DUT from above, so that it is visible to the optics via opening 485. A stage inside the chamber 400 enables placing of the collecting optics at any locations within the opening 485.

Figure 5:
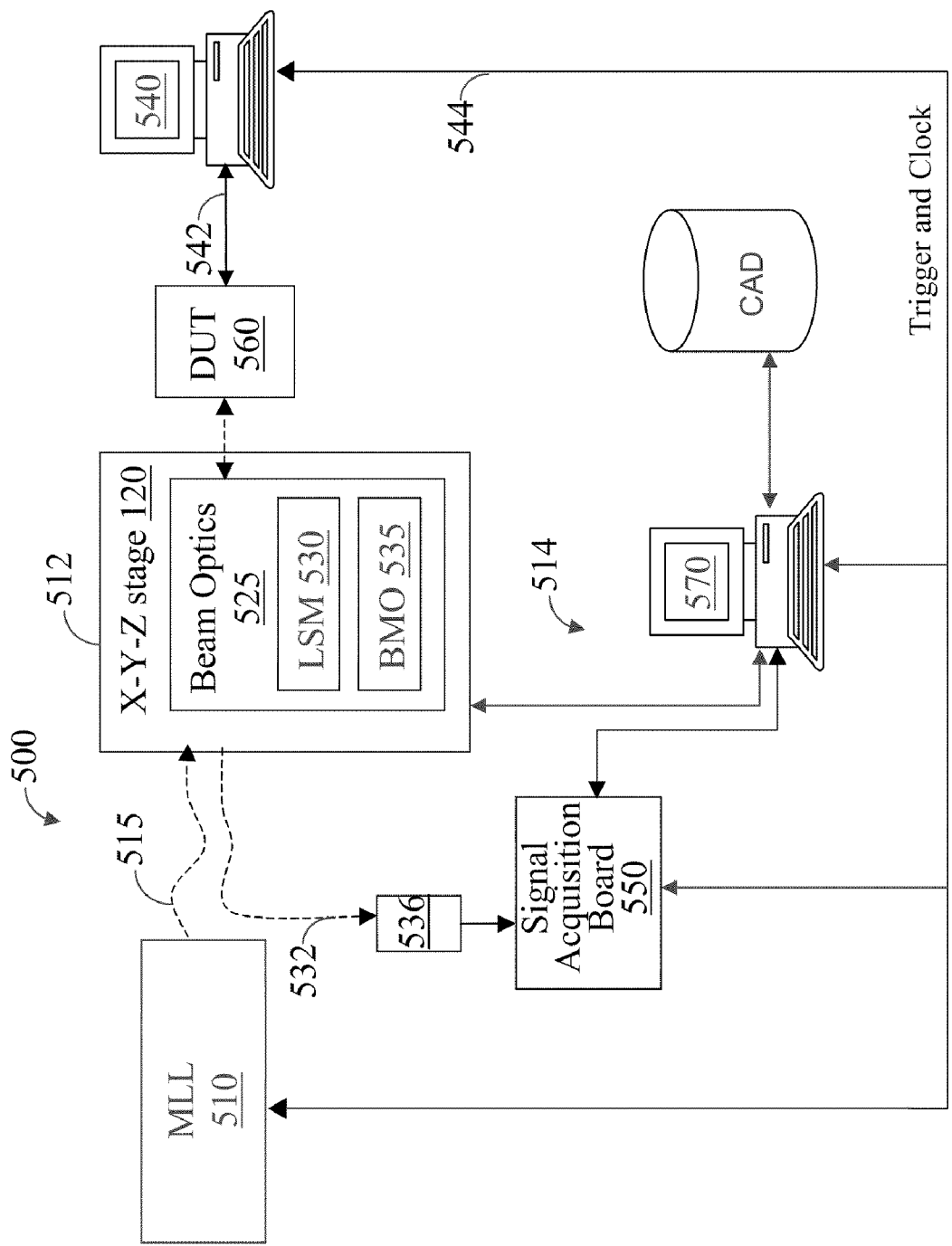
FIG. 5 is a general schematic depicting major components of a probing microscope which may be used for implementing embodiments of the invention.

FIG. 5 is a general schematic depicting major components of a probing microscope which may be used for implementing embodiments of the invention. In FIG. 5, dashed arrows represent optical path, while solid arrows represent electronic signal path. The optical paths represented by dashed lines are generally made using fiber optic cables. Probing system 500 comprises a laser light source, e.g., a CW or mode-locked laser source MLL 510, an optical bench 512, and data acquisition and analysis apparatus 514. The optical bench 512 includes provisions for mounting the wafer 560 and includes beam optics 525. The beam optics may include various elements to shape the beam, generally shown as beam manipulation optics, BMO 535, and elements for pointing and/or scanning the beam over the DUT, such as a laser scanning microscope, LSM 530. A computer 540 or other device, e.g., ATE, may be used to provide power and/or signals, 542, to the DUT 560 via the probing card, and may provide trigger and clock signals, 544, to the mode-locked laser source 510 and/or the analysis apparatus 514. The analysis apparatus, 514, includes workstation 570, which controls processes and displays data from the signal acquisition board 550 and the optical bench 512.

In operation, computer 540, which may be a conventional ATE, generates test vectors that are electrically fed to the DUT 560. When emission testing is performed, the optics collects the faint light that is emitted from active devices on the DUT, and directs the collected light to the photodetector 536. The photodetector, e.g., avalanche photodiode (APD) converts the collected light into an electrical signal that is sent to the signal acquisition board. The signal can be then analyzed using the computer 570.

On the other hand, when laser probing is performed, the ATE also sends sync signal 544 to the mode-locked laser source 510, which emits a laser beam. The beam optics 525 is then used to point the beam to illuminates various positions on the DUT. The beam reflects from the DUT, but the reflection is perturbed by the DUT's response to the test vectors 542. This perturbed reflection is detected by photodetector 536, which converts it into an analog signal. The analog signal is acquired by the signal acquisition board 550 and is fed to computer 570, where it is displayed as a waveform corresponding to the perturbed reflection from the DUT. By correlating the timeline of the waveform to that of the ATE, the response of the DUT can be analyzed.

As can be understood, in order to make the systems of FIGS. 4 and 5 operable, the electrical vector signals need to be properly communicated to the DUT. For this purpose, the pins on the probe adapter must be precisely placed on the pads of the DUT. Improper alignment may cause incorrect signals or no signals being communicated to the DUT, and may damage the DUT or the pins.

Figures 6, 7:
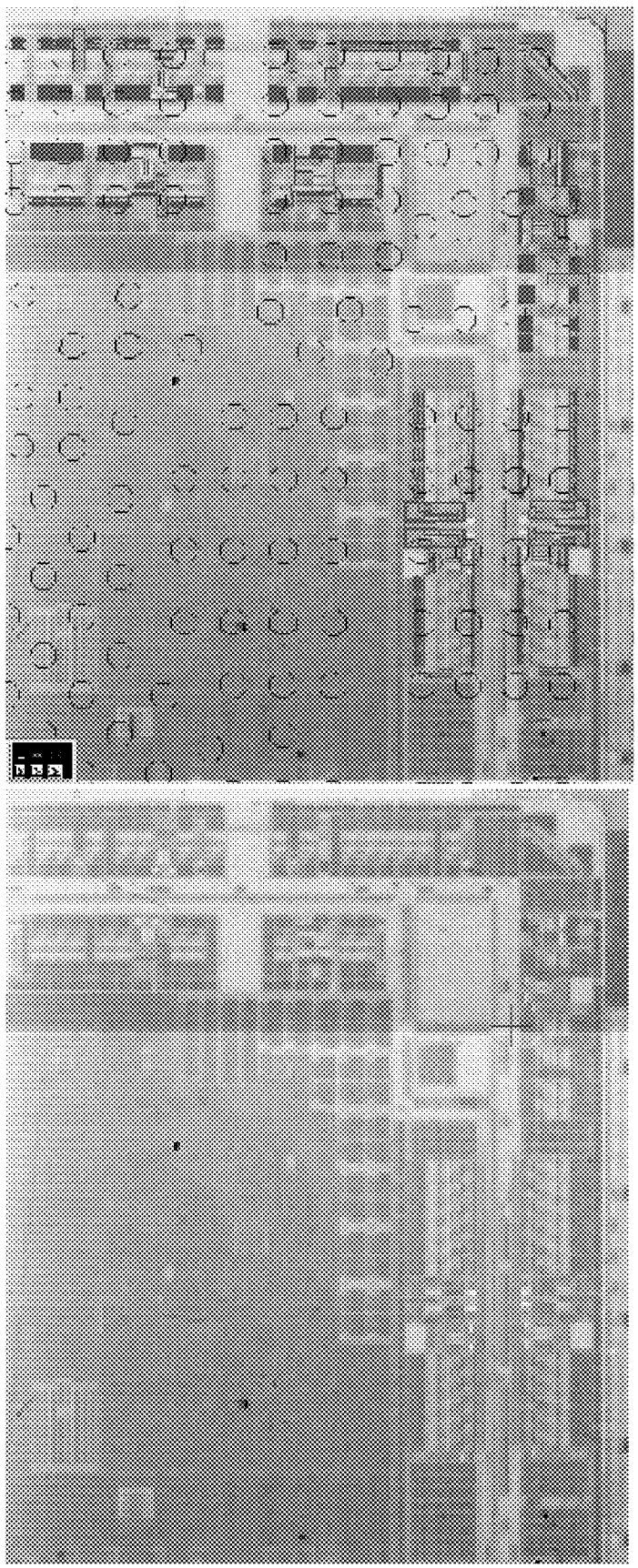
FIG. 6 shows a modern device as viewed with an infrared microscope.
FIG. 7 shows the infra-red image of device with corresponding CAD design data taken from a CAD database (FIG. 5) and overlaid and registered to the infra-red image using physical device positions.

When using optical probers such as those illustrated in FIGS. 4 and 5, one can use the laser of the prober to take an infrared image of the DUT, e.g., by scanning the laser using the LSM. FIG. 6 shows a modern device as viewed with an infrared microscope. As can be seen, the inner metal layers completely obscure any view of probe pads or probe tips above the device. Therefore, existing methods of alignment, which rely upon a view of both probe pads and probe tips cannot be used on this device.

FIG. 7 shows the backside infrared image of device with corresponding CAD design data taken from a CAD database (FIG. 5) and overlaid and registered to the infrared image using physical device positions. In FIG. 7, the circles indicate the positions of the top layer probe pads. The combination of the device image taken by the upward-looking camera and its overlaid CAD design form a "virtual device" which can be compared with the physical probe tip array. This overcomes the problem of attempting to take an image of the pads through the obscuring metal layers of the DUT.

Figure 8:
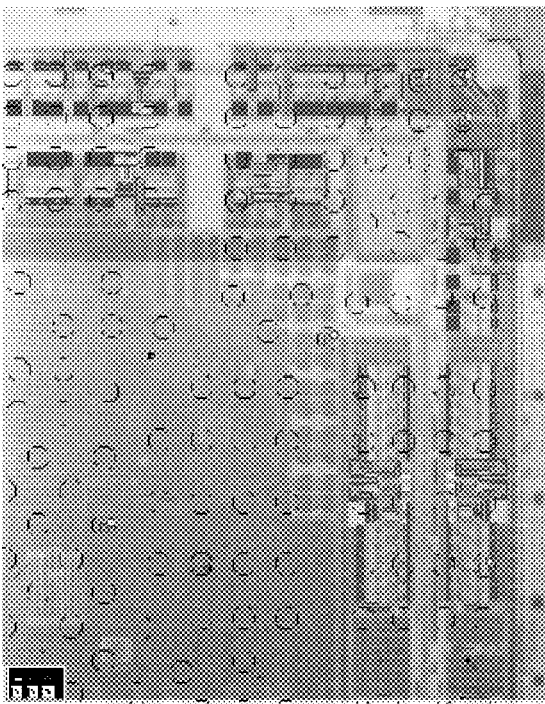
FIG. 8 shows desired probe positions identified and highlighted for comparison to the probe tip array.

FIG. 8 shows probe positions identified and highlighted for comparison to the probe tip array. That is, using the virtual device image of FIG. 7, several probing points are marked for the next step of registration. This can be done by simply having the operator "point and click" to desired probing point using a mouse or other pointing device coupled to computer 570. Notably, not all of the probing points need to be highlighted, but rather only sufficient probing points to enable recognizing registration errors in x-y and theta (rotation).

Figure 9:
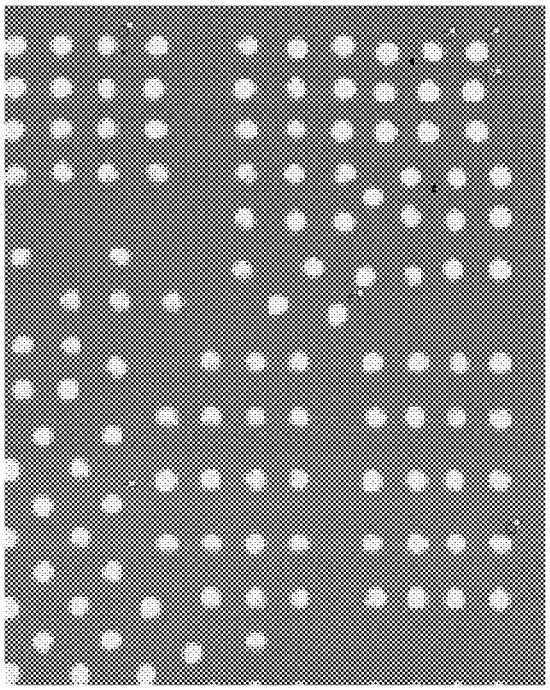
FIG. 9 shows an image of the probe tip array as viewed with an infrared microscope.
Figure 10:
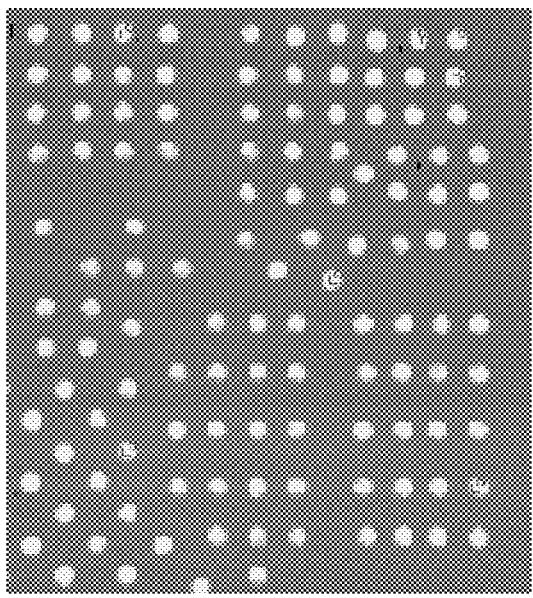
FIG. 10 shows the probe tip array position compared to the probe pad locations on the device after alignment is completed.

FIG. 9 shows an image of the probe tip array as viewed with an infrared microscope. To obtain this image, the wafer has been moved to a holding position so that an unobstructed view of the probe tip array is available. Then, the infrared camera is used to obtain an image of the probe tip array. Wafer probe positions previously identified are shown overlaid on the image for position comparison. The probe card is then moved in theta (rotation) until the probe card angle matches the wafer angle. The wafer is then moved in X and Y until its position matches the probe array position. FIG. 10 shows the probe tip array position compared to the probe pad locations on the device after alignment is completed.

FIG. 11 illustrates a flow chart of a process according to an embodiment of the invention for aligning probe card pins to contact pads of die on a wafer. At step 1100 the wafer is loaded to the system, wherein the system has an infrared imager with a view of the backside of the wafer. In this context, backside means the surface opposite to the surface having the contact pads. As explained with respect to FIGS. 4 and 5, the laser and infrared imaging optics are positioned to observe the backside of the wafer since that is the surface where photon emission and laser probing can be performed. Once the wafer is loaded, the infrared imager is used to scan the selected die on the wafer to obtain an image from the lower surface of the wafer.

At step 1110 the CAD design data of the wafer is loaded from a CAD database (see FIG. 5) and the data is aligned and registered to the laser image of the die. That is, various visible elements in the laser image are registered to their CAD design data. An example is shown in FIG. 7, wherein device elements are shown as rectangles. The CAD data also includes contact pads, and these are shown in FIG. 7 as circles. Since the CAD data is registered to actual device elements on the die, the location of the contact pads indicated by the CAD data should be registered to the actual location of the contact pads, although the contact pads are obstructed and therefore not visible in the infrared image.

In step 1115, selected contact pads are marked for matching to the probe card's pins. The pads can be selected by simply having an operator use a pointing device, such as a mouse, clicking on the desired contact pads, thereby marking these pads for the computer processor, which generates the graphic marks as illustrated in FIG. 8.

In step 1120 the wafer is removed and is parked, e.g., on parking pins 426, such that the upward-looking imager has clear line of sight to the probe card. At this point, the image of the wafer can be removed from the screen, leaving only the markings for the contact pads. At step 1125 the upward-looking imager is used to image the probe card. The image of the probe card is then overlaid over the markings of the contact pads and at step 1130 the image is examined to see whether the pins of the probe card are rotationally aligned with the markings—see FIG. 9. If they are aligned, the process proceeds to step 1135, wherein the wafer is loaded and is moved in x-y if needed. On the other hand, if at step 1130 the pins are not aligned, the process proceeds to step 1140, wherein the probe board is rotated until the results of the inspection in step 1130 results in alignment.

There are occasions when wafer CAD design information is unavailable. FIG. 12 illustrates an embodiment that can be used in such circumstances to reach alignment without the need for a special camera and optical setup to simultaneously view wafer dies and probe cards. The system shown in the embodiment of FIG. 12 is similar to that shown in FIG. 4, so similar elements are indicated with similar reference, except that they are in the 12xx series rather than 4xx series. In the embodiment of FIG. 12, a high resolution camera is used to take a picture of the top side of the wafer, i.e., the contact pads side. Although not strictly required, a telecentric imaging camera is particularly beneficial for this embodiment, so as to assure a properly scaled view of the entire die, which does not have any distortion of magnification of the image radially from the center of the image. Also, the zoom and focus can be adjusted so that a whole die field of view can be achieved.

Figure 13:
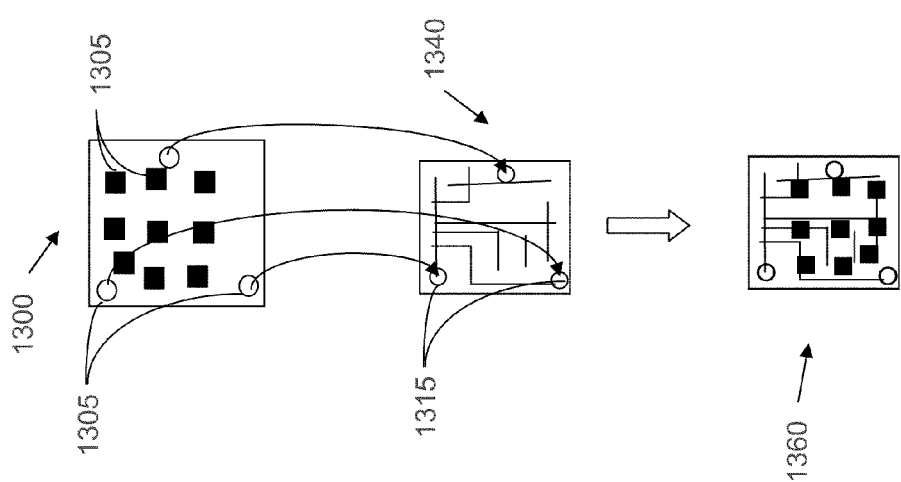
FIG. 13 is an example of a front image rendered translucent and merged to the backside image of the wafer.

Then, the upward-looking infrared camera of the probing microscope is used to take an image of the underside of the die, similar to the image taken in the previous embodiment. The top-side digital image is then manipulated digitally to scale, rotate, clip, and otherwise match it to the backside image of the die as captured by the microscope's upward looking IR camera. The image is then rendered translucent and merged to the backside image. As shown in FIG. 13, the top image 1300 shows the pads 1310 and some other features 1305. The backside image 1340 shows some features that are not visible in the topside image, but also some features 1315 which correspond to the features 1305 which are visible in the topside image. Using these features, the topside image is scaled and manipulated to fit the size and angular position of the backside image. The topside image is then flipped and "pinned" to the backside image using the features that are visible in both topside and backside images, so as to provide a composite image 1360. That is, the top side image is matched to edge features which are visible both from the top side and back side of the die and a composite "virtual transparent" die image is created.

The "transparent" feature refers to the fact that a normal imaging of the device backside, as captured by an IR microscope, cannot see through the device to its top side because intervening metal layers in the semiconductor device obscure the image. By merging the front side and back side images into a single image, an image is created that is similar to what would be seen if the device were transparent. Because this image is based on actual images of the die to be aligned, it can now be used in the wafer prober Probe-to-Pad alignment process in the same fashion as has been described in the previous embodiment using CAD design data. Therefore, no device CAD information is required to use this technique.

Figure 14:
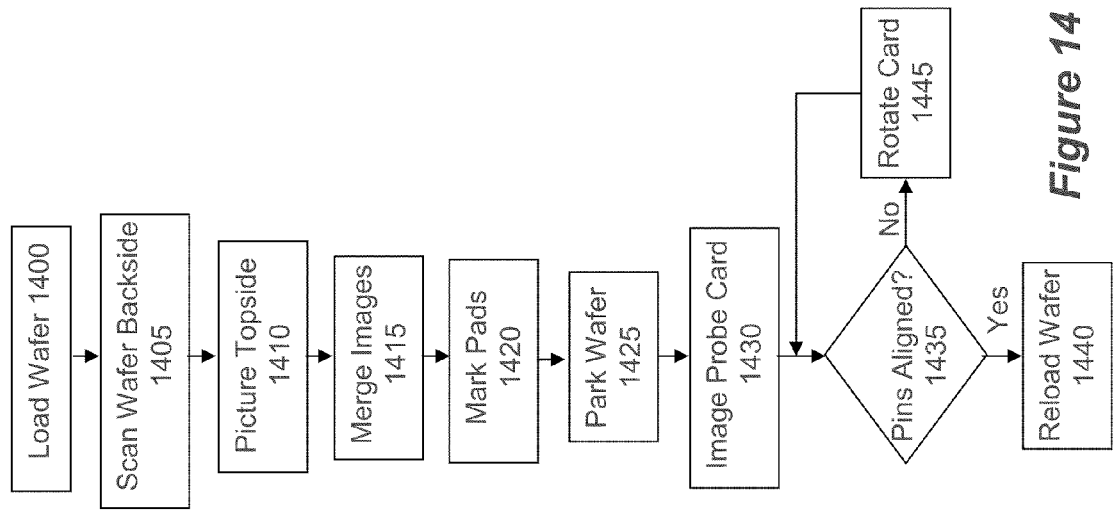
FIG. 14 illustrates a process for aligning the probe card pins to the contact pads when no CAD design data is available.

FIG. 14 illustrates a process for aligning the probe card pins to the contact pads when no CAD design data is available. At step 1400 the wafer is loaded onto the system. At step 1405 the backside of a selected die on the wafer is imaged using the system's laser and imaging optics. At step 1410 the topside of the same die is imaged using a high resolution camera. Note that the order of steps 1405 and 1410 can be reversed. At step 1415 the topside digital image is digitally manipulated to correspond to the size and be aligned with the backside laser image, and is flipped and merged with the backside laser image to generate a virtual transparent image of the die. At step 1420 selected contact pads (visible from the topside image) are marked for alignment. At step 1425 the wafer is parked, e.g., on parking pins 1226, and at step 1430 the laser imaging system images the tips of the probe card. At step 1435 it is checked whether the pins are aligned with the marks of the selected contact pads. If so, the wafer is reloaded at step 1440. On the other hand, if the card is not properly aligned, at step 1445 the probe card is rotated and alignment is checked until the card is aligned.

Figure 16:
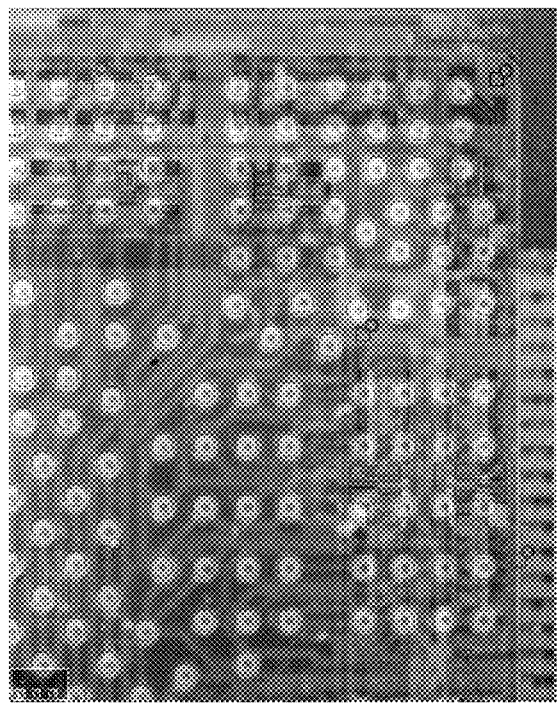
FIG. 16 illustrates an example of an image showing selected contact pads (visible from the topside image and confirmed by the CAD data) are marked for alignment.
Figure 15:
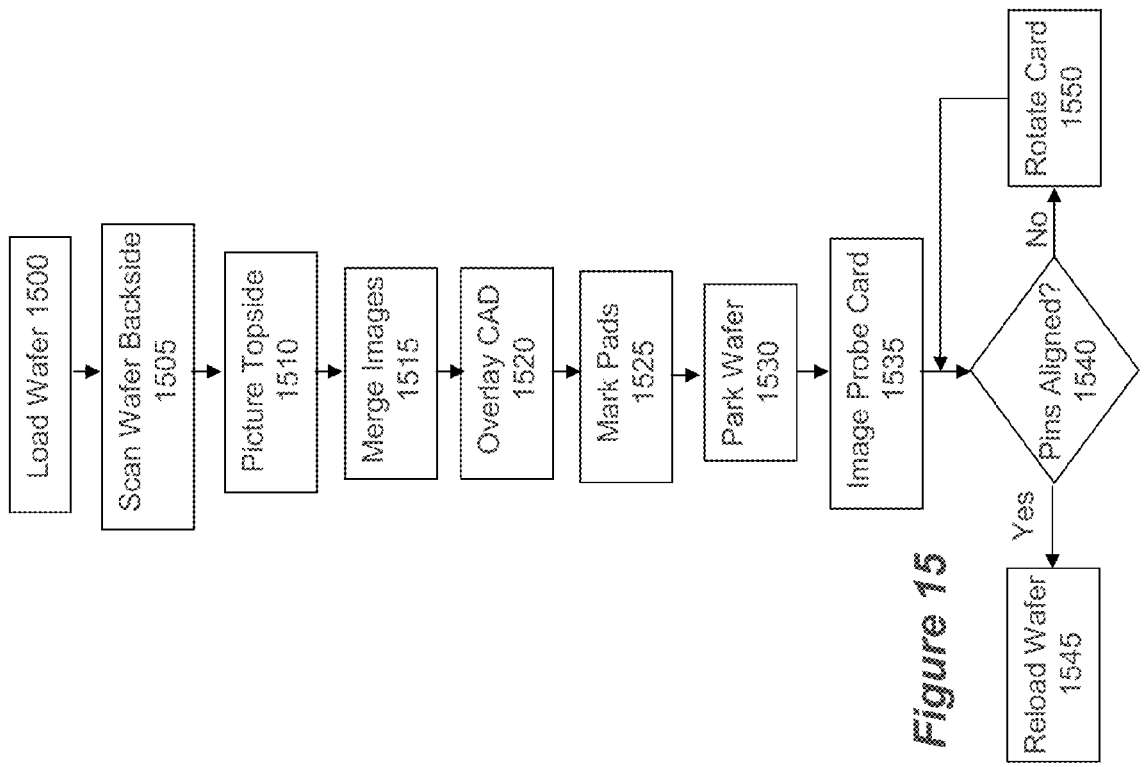
FIG. 15 illustrates yet another embodiment according to which, when CAD design data is available, it is used as verification for the accuracy in selecting the contact pads for alignment.

FIG. 15 illustrates yet another embodiment according to which, when CAD design data is available, it is used as verification for the accuracy in selecting the contact pads for alignment. In step 1500 the wafer is loaded and in step 1505 the backside of a selected die is imaged using the system's laser and imaging optics. At step 1510 the topside of the same die is imaged using a high resolution camera. Note that the order of steps 1505 and 1510 can be reversed. At step 1515 the topside digital image is digitally manipulated to correspond to the size and be aligned with the backside laser image, and is flipped and merged with the backside laser image to generate a virtual transparent image of the die. At step 1520 the CAD design data is overlaid over the virtual transparent image to confirm the alignment of the top image to the backside image. If there are discrepancies, the topside digital image is manipulated to conform to the CAD design data. At step 1525, selected contact pads (visible from the topside image and confirmed by the CAD data) are marked for alignment. A sample of such an image is shown in FIG. 16. At step 1530 the wafer is parked and at step 1535 the laser imaging system images the tips of the probe card. At step 1540 it is checked whether the pins are aligned with the marks of the selected contact pads. If so, the wafer is reloaded at step 1545. On the other hand, if the card is not properly aligned, at step 1550 the probe card is rotated and alignment is checked until the card is aligned.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of functional elements will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the relevant arts. It is intended that the specification and examples be considered as exemplary only, with a true scope and spirit of the invention being indicated by the following claims.

The invention claimed is:

1. A method of performing alignment of an array of probe tips of a probe card to corresponding contact pads for wafer probing applications, comprising the steps of:
   obtaining a backside image of a wafer;
   obtaining a mapping of contact pads lying on a top side of the wafer opposite the backside;
   overlaying the mapping of contact pads over the backside image so as to create an image showing the contact pads superimposed on the backside image of the wafer;
   selecting at least some of the contact pads as landing points;
   obtaining an image of the probe tips array;
   comparing the landing points to corresponding positions of the probe tips; and,
   if the positions of the probe tips are not aligned with the corresponding landing points, rotating the probe card to align the positions of the probe tips to the landing points.

2. The method of claim 1, wherein obtaining a mapping of the contact pads comprises obtaining CAD design data of the wafer, and wherein overlaying the mapping of contact pads comprises overlaying the CAD design data over the backside image.

3. The method of claim 1, wherein obtaining a mapping of the contact pads comprises obtaining a digital image of the topside of the wafer, and wherein overlaying the mapping of the contact pads comprises overlaying the digital image over the backside image.

4. The method of claim 3, wherein obtaining a mapping of the contact pads further comprises obtaining CAD design data of the wafer, and wherein overlaying the mapping of contact pads further comprises overlaying the CAD design data over the backside image.

5. The method of claim 3, wherein overlaying the mapping of the contact pads over the backside image further comprises digitally manipulating the digital image to match features visible in the backside image.

6. The method of claim 5, wherein overlaying the mapping of the contact pads over the backside image further comprises digitally manipulating the digital image to match features in the CAD design data.

7. The method of claim 5, wherein digitally manipulating comprises at least one of scaling, rotating, and cropping.

8. A wafer probing system, comprising:
   a bench having an opening configured for placing a wafer thereupon;
   a laser source;
   optical system configured for inspecting the back side of the wafer using an infrared imager,
   a processor configured for enabling alignment of an array of probe tips of a probe card to corresponding contact pads of the wafer by performing the steps comprising:
   loading the wafer onto the bench;
   operating the optical system to obtain a backside image of the die on the wafer;
   obtaining a mapping of contact pads lying on a top side of the wafer opposite the backside;
   overlaying the mapping of contact pads over the backside image, so as to create an image showing the contact pads superimposed on the backside image of the wafer;

marking at least some of the contact pads as landing points;
parking the wafer away from the opening;
operating the optical system to obtain an image of the probe tips array;
comparing the landing points to corresponding positions of the probe tips; and,
if the positions of the probe tips are not aligned with the corresponding landing points, rotating the probe card to align the positions of the probe tips to the landing points.

9. The wafer probing system of claim 8, wherein the processor is further configured to receive a CAD design data of the wafer and enable overlaying the CAD design data over the backside image.

10. The wafer probing system of claim 8, further comprising a digital camera positioned to obtain a digital image of topside of the wafer, and wherein the processor is further configured to enable overlaying the digital image over the backside image.

11. The wafer probing system of claim 10, wherein the processor is further configured to receive a CAD design data of the wafer and enable overlaying the CAD design data over the backside image.

12. The wafer probing system of claim 10, wherein the processor is further configured to enable digitally manipulating the digital image to match features visible in the backside image.

13. The wafer probing system of claim 12, wherein the processor is further configured to enable digitally manipulating the digital image to match features in the CAD design data.

14. The wafer probing system of claim 13, wherein the processor is further configured to enable at least one of scaling, rotating, and cropping the digital image.

15. In a wafer probing system having a bench with an opening configured for placing a wafer thereupon and an infrared imaging system for imaging the backside of the wafer through the opening, a method for enabling alignment of an array of probe tips of a probe card to corresponding contact pads of a die on the wafer, the method comprising the steps of:
loading the wafer onto the bench;
operating the infrared imaging system to obtain a backside image of the die on the wafer;
obtaining a mapping of contact pads lying on a top side of the wafer opposite the backside;
overlaying the mapping of contact pads over the backside image, so as to create an image showing the contact pads superimposed on the backside image of the wafer;
marking at least some of the contact pads as landing points;
parking the wafer away from the opening;
operating the imaging system to obtain an image of the probe tips array;
comparing the landing points to corresponding positions of the probe tips; and,
if the positions of the probe tips are not aligned with the corresponding landing points, rotating the probe card to align the positions of the probe tips to the landing points.

16. The method of claim 15, wherein obtaining a mapping of the contact pads comprises obtaining CAD design data of the wafer, and wherein overlaying the mapping of contact pads comprises overlaying the CAD design data over the backside image.

17. The method of claim 15, wherein obtaining a mapping of the contact pads comprises obtaining a digital image of the topside of the wafer, and wherein overlaying the mapping of the contact pads comprises overlaying the digital image over the backside image.

18. The method of claim 17, wherein obtaining a mapping of the contact pads further comprises obtaining CAD design data of the wafer, and wherein overlaying the mapping of contact pads further comprises overlaying the CAD design data over the backside image.

19. The method of claim 17, wherein overlaying the mapping of the contact pads over the backside image further comprises digitally manipulating the digital image to match features visible in the backside image.

20. The method of claim 19, wherein overlaying the mapping of the contact pads over the backside image further comprises digitally manipulating the digital image to match features in the CAD design data.

* * * * *